United States Patent
Pushp et al.

(10) Patent No.: US 11,386,320 B2
(45) Date of Patent: Jul. 12, 2022

(54) MAGNETIC DOMAIN WALL-BASED NON-VOLATILE, LINEAR AND BI-DIRECTIONAL SYNAPTIC WEIGHT ELEMENT

(71) Applicant: INTERNATIONAL BUSINESS MACHINES CORPORATION, Armonk, NY (US)

(72) Inventors: Aakash Pushp, Santa Clara, CA (US); Pritish Narayanan, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 602 days.

(21) Appl. No.: 16/294,598

(22) Filed: Mar. 6, 2019

(65) Prior Publication Data

US 2020/0285946 A1 Sep. 10, 2020

(51) Int. Cl.
*H01L 43/02* (2006.01)
*G06N 3/063* (2006.01)
*H01L 43/08* (2006.01)

(52) U.S. Cl.
CPC .............. *G06N 3/063* (2013.01); *H01L 43/02* (2013.01); *H01L 43/08* (2013.01)

(58) Field of Classification Search
CPC .......... G06N 3/063; H01L 43/02; H01L 43/08
USPC .......................................................... 706/39
See application file for complete search history.

(56) References Cited

U.S. PATENT DOCUMENTS

| | | | |
|---|---|---|---|
| 6,072,718 A | 6/2000 | Abraham et al. | |
| 7,525,862 B1 * | 4/2009 | Sun | G11C 11/14 365/158 |
| 7,548,460 B2 | 6/2009 | Diorio et al. | |
| 7,579,197 B1 | 8/2009 | Li | |
| 7,869,266 B2 * | 1/2011 | Ranjan | G11C 11/1673 365/158 |
| 7,936,596 B2 | 5/2011 | Li | |
| 8,589,320 B2 | 11/2013 | Breitwisch et al. | |
| 8,625,337 B2 | 1/2014 | Wu et al. | |

(Continued)

FOREIGN PATENT DOCUMENTS

| | | |
|---|---|---|
| CN | 1 05633111 | 6/2016 |
| CN | 106876582 | 6/2017 |
| WO | WO2018080159 A1 | 5/2018 |

OTHER PUBLICATIONS

PCT Search Report, International application No. PCT/IB2020/051794, dated May 28, 2020, 8 pages.

(Continued)

*Primary Examiner* — Jami Valentine Miller
(74) *Attorney, Agent, or Firm* — Schmeiser, Olsen & Watts, LLP; Randall Bluestone

(57) ABSTRACT

A magnetic double tunnel junction (MDTJ) (which, preferably, has a large aspect ratio, wherein length L of the MDTJ>>width w of the MDTJ) has magnetic domain wall(s) or DW(s) in the free layer of the MDTJ, wherein controlled movement of the DW(s) across the free layer is effected in response to the polarity, magnitude, and duration of a voltage pulse across the MDTJ. The motion and relative position of DW(s) causes the conductance of the MDTJ (that is measured across the MDTJ) to change in a symmetric and linear fashion. By reversing the polarity of the bias voltage, the creation and/or direction of the DW(s) motion can be reversed, thereby allowing for a bi-directional response to the input pulse.

36 Claims, 12 Drawing Sheets

(56) References Cited

U.S. PATENT DOCUMENTS

| | | | |
|---|---|---|---|
| 8,634,233 B2 | 1/2014 | Lilja et al. | |
| 9,355,699 B2 | 5/2016 | Khalili et al. | |
| 9,734,880 B1 | 8/2017 | Augustine et al. | |
| 10,056,126 B1 | 8/2018 | Katti | |
| 10,374,148 B1* | 8/2019 | Choi | H01L 27/222 |
| 10,381,548 B1* | 8/2019 | Choi | G11C 11/005 |
| 10,714,242 B2* | 7/2020 | Abel | H01C 7/006 |
| 2009/0080239 A1 | 3/2009 | Nagase | |
| 2012/0280336 A1 | 11/2012 | Jan et al. | |
| 2013/0028015 A1 | 1/2013 | Matsui | |
| 2013/0235653 A1 | 9/2013 | Kondo | |
| 2014/0119111 A1 | 5/2014 | Nakamura et al. | |
| 2015/0269478 A1 | 9/2015 | Datta et al. | |
| 2015/0347896 A1 | 12/2015 | Roy | |
| 2017/0249550 A1 | 8/2017 | Sengupta | |
| 2017/0294482 A1 | 10/2017 | Hu | |
| 2020/0058339 A1* | 2/2020 | Hong | G11C 11/54 |
| 2020/0285946 A1* | 9/2020 | Pushp | G06N 3/063 |
| 2021/0334234 A1* | 10/2021 | Yudanov | G06F 15/8092 |

OTHER PUBLICATIONS

UK Examination Report, dated Oct. 5, 2021, App No. GB2113036.4, 6 pages.

Lequeux, S. et al., "A Magnetic Synapse: Multilevel Spin-Torque Memristor with Perpendicular Anisotropy," Scientific Reports, Aug. 19, 2016, 7pgs.

UK Examination Report, dated Feb. 3, 2022, App No. GB2113036.4, 5 pages.

UK Examination Report, dated Jan. 20, 2022, App No. GB2113036.4, 4 pages.

UK Examination Report, dated Mar. 24, 2022, App No. GB2113036.4, 3 pages.

UK Examination Report, dated Apr. 7, 2022, App No. GB2113036.4, 4 pages.

* cited by examiner

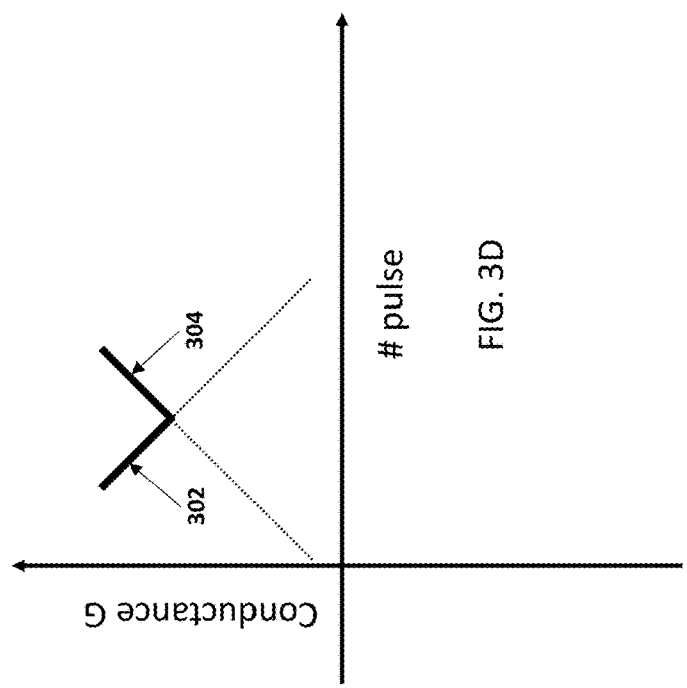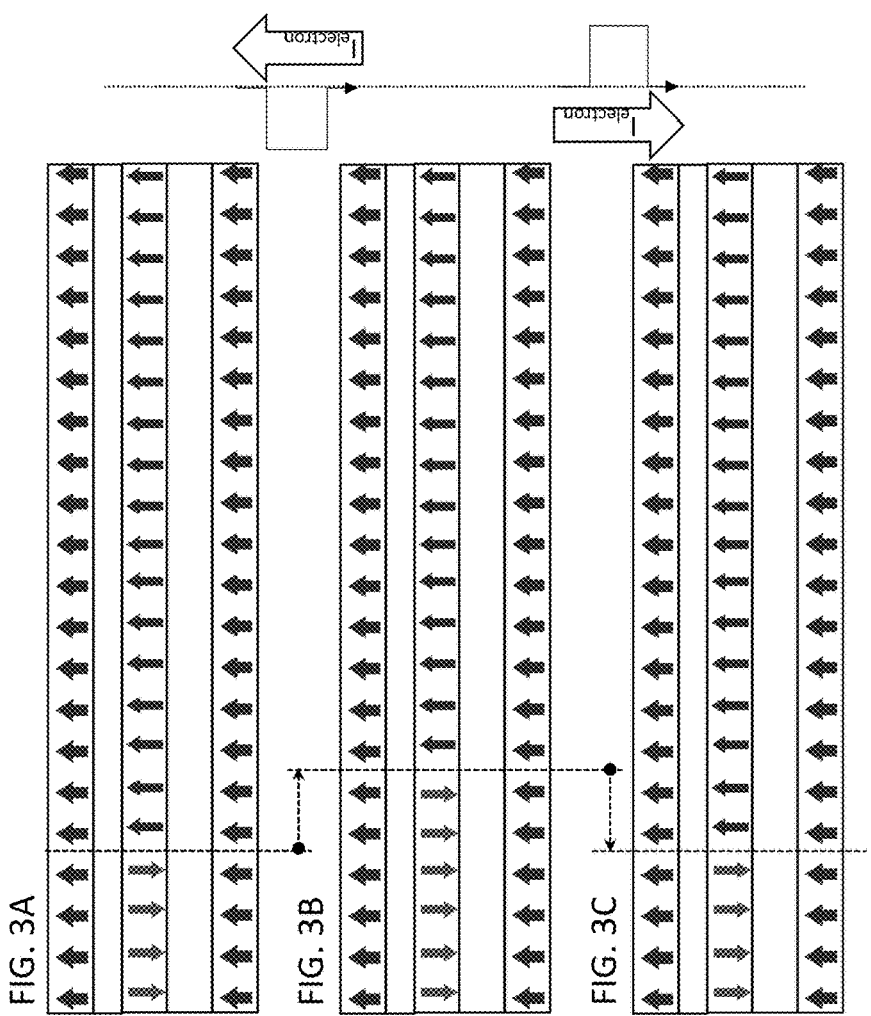

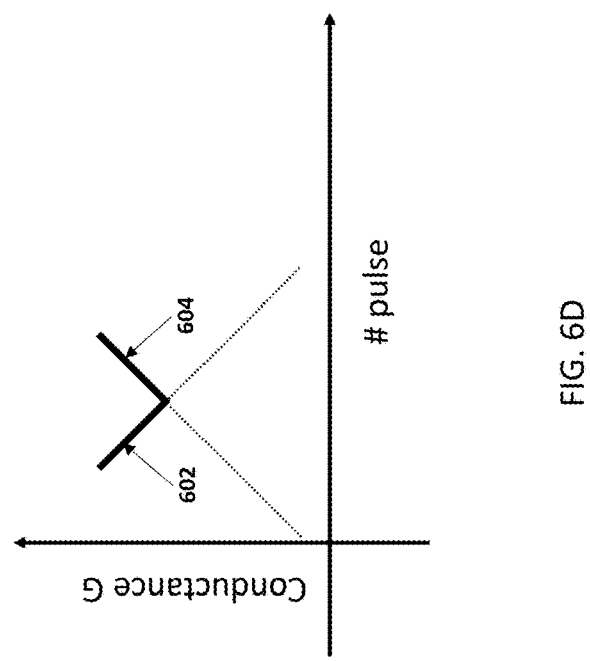
FIG. 6D
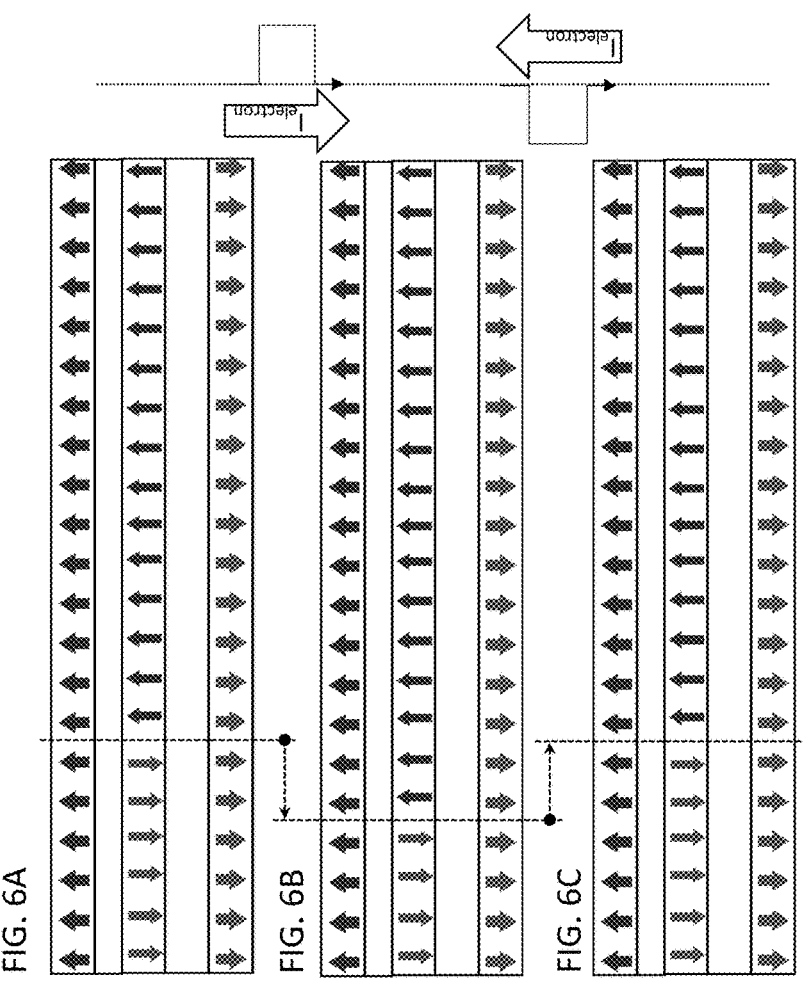
FIG. 6A
FIG. 6B
FIG. 6C

TO INCREASE CONDUCTANCE:

applying a first bias voltage, V, between the upper electrical contact and the lower electrical contact, wherein the first bias voltage, V, induces a first current, $I_1$, travelling from the upper electrical contact to the lower electrical contact, the first bias voltage, V, creates and/or moves at least one magnetic domain wall in the magnetic free layer in a first direction, wherein movement of the at least one magnetic domain wall in the first direction increases, linearly, the conductance of the synaptic weight element

TO DECREASE CONDUCTANCE:

applying a second bias voltage, V', between the upper electrical contact and the lower electrical contact, wherein the second bias voltage V' is opposite in polarity to that of the first bias voltage, V, and the second bias voltage, V', induces a second current, $I_2$, travelling from the lower electrical contact to the upper electrical contact, the second bias voltage, V', creates and/or moves at least one magnetic domain wall in the magnetic free layer in a second direction that is opposite that of the first direction, wherein movement of the at least one magnetic domain wall in the second direction decreases, linearly, the conductance of the synaptic weight element

FIG. 11B

MAGNETIC DOMAIN WALL-BASED NON-VOLATILE, LINEAR AND BI-DIRECTIONAL SYNAPTIC WEIGHT ELEMENT

BACKGROUND OF THE INVENTION

Field of Invention

The present invention relates generally to the field of synaptic weight elements (in, for example, a crossbar array). More specifically, the present invention is related to magnetic domain wall-based non-volatile, linear and bi-directional synaptic weight elements.

Discussion of Related Art

A deep learning network, or a neural network, or other machine learning algorithms rely upon a multiply-accumulate function (relevant for matrix multiplication, etc.). This can be most efficiently implemented in a cross-bar array of nominally identical synaptic elements that exhibit preferentially linear but necessarily bi-directional and symmetric conductance response to an input signal.

Synaptic elements that have been used in the prior art generally include, among others, Phase change Material (PCM), Resistive Random Access Memory (RRAM), and Ferroelectric RAM (FeRAM). Another prior art implementation as disclosed in the paper by Lequeux et al. ("A Magnetic Synapse: Multilevel Spin-Torque Memristor with Perpendicular Anisotropy," *Scientific Reports*, 6:31510, 2016) uses "memristors" which are non-volatile nano-resistors, where the resistance of such nano-resistors can be tuned by applied currents or voltages and set to a large number of levels.

Embodiments of the present invention are an improvement over prior art systems and methods.

SUMMARY OF THE INVENTION

In one embodiment, the present invention provides a method of adjusting conductance of a synaptic weight element, wherein the synaptic weight element comprises: (i) an upper electrical contact; (ii) a first magnetic reference layer directly underlying the upper electrical contact; (iii) a first insulating tunnel barrier directly underlying the first magnetic reference layer; (iv) a magnetic free layer directly underlying the first insulating to tunnel barrier; (v) a second insulating tunnel barrier directly underlying the magnetic free layer; (vi) a second magnetic reference layer directly underlying the second insulating tunnel barrier, and (vii) a lower electrical contact directly underlying the second magnetic reference layer, the first and second insulating tunnel barriers having different electrical resistance. In one aspect, there is a method that includes the steps of: (a) when the conductance of the synaptic weight element is to be increased, applying a first bias voltage V between the upper electrical contact and the lower electrical contact, so that the first bias voltage V induces a first voltage $V_1$ across the first insulating tunnel barrier and induces a second voltage $V_2$ across the second insulating tunnel barrier, wherein $V=V_1+V_2$ and $V_1 \neq V_2$, wherein the first bias voltage V creates and/or moves at least one magnetic domain wall in the magnetic free layer in a first direction, wherein creation and/or movement of the at least one magnetic domain wall in the first direction increases the conductance of the synaptic weight element; and (b) when the conductance of the synaptic weight element is to be decreased, applying a second bias voltage V' between the upper electrical contact and the lower electrical contact, the second bias voltage V' being opposite in polarity to that of the first bias voltage V, the second bias voltage V' inducing a third voltage $V_3$ across the first insulating tunnel barrier and inducing a fourth voltage $V_4$ across the second insulating tunnel barrier, wherein $V'=V_3+V_4$ and $V_3 \neq V_4$, and the second bias voltage V' creates and/or moves at least one magnetic domain wall in the magnetic free layer in a second direction that is opposite that of the first direction, and wherein creation and/or movement of the at least one magnetic domain wall in the second direction decreases the conductance of the synaptic weight element.

In another aspect of the invention, there is a method of adjusting conductance of a synaptic weight element, wherein the synaptic weight element comprises: (i) an upper electrical contact; (ii) a first magnetic reference layer directly underlying the upper electrical contact; (iii) a first insulating tunnel barrier directly underlying the first magnetic reference layer; (iv) a magnetic free layer directly underlying the first insulating tunnel barrier; (v) a second insulating tunnel barrier directly underlying the magnetic free layer; (vi) a second magnetic reference layer directly underlying the second insulating tunnel barrier, and (vii) a lower electrical contact directly underlying the second magnetic reference layer, the first and second insulating tunnel barriers of different electrical resistance. This method comprises the steps of: (a) when the conductance of the synaptic weight element is to be decreased, applying a first bias voltage V between the upper electrical contact and the lower electrical contact, so that the voltage V induces a first current $I_1$ travelling from the upper electrical contact to the lower electrical contact, the first bias voltage V creating and/or moving at least one magnetic domain wall in the magnetic free layer in a first direction, wherein creation and/or movement of the at least one magnetic domain wall in the first direction decreases the conductance of the synaptic weight element; and (b) when the conductance of the synaptic weight element is to be increased, applying a second bias voltage V between the upper electrical contact and the lower electrical contact, the second bias voltage V' being opposite in polarity to that of the first bias voltage V, the second bias voltage V' inducing a second current $I_2$ travelling from the lower electrical contact to the upper electrical contact, wherein the second bias voltage V' creates and/or moves at least one magnetic domain wall in the magnetic free layer in a second direction that is opposite that of the first direction, and wherein creation and/or movement of the at least one magnetic domain wall in the second direction increases the conductance of the synaptic weight element.

In one embodiment, the present invention provides a device comprising: (i) a first magnetic layer; (ii) a first tunnel barrier underlying the first magnetic layer; (iii) a second magnetic layer underlying the tunnel barrier; (iv) a second tunnel barrier underlying the second magnetic free layer, the first and second tunnel barriers of different electrical resistance; and (v) a third magnetic layer underlying the second tunnel barrier, wherein the first magnetic layer, the first tunnel barrier, the second magnetic layer, the second tunnel barrier and the third magnetic layer are in proximity with each other, thereby forming a stack of layers, so that when current passes through the stack, the current creates and/or moves at least one magnetic domain wall in the second magnetic layer.

In another embodiment, the present invention provides a device comprising: (i) a first magnetic layer; (ii) a first tunnel barrier underlying the first magnetic layer; (iii) a second magnetic layer underlying the tunnel barrier; (iv) a second tunnel barrier underlying the second magnetic free layer, the first and second tunnel barriers being of different electrical resistance; and (v) a third magnetic layer underlying the second tunnel barrier, wherein the first magnetic layer, the first tunnel barrier, the second magnetic layer, the second tunnel barrier and the third magnetic layer are in proximity with each other, thereby forming a stack of layers, so that when tunnel current passes through the first magnetic layer, the first tunnel barrier, the second magnetic layer, the second tunnel barrier and the third magnetic layer in turn, the tunnel current creates and/or moves a magnetic domain wall or a plurality of domain walls in the second magnetic layer.

BRIEF DESCRIPTION OF THE DRAWINGS

The present disclosure, in accordance with one or more various examples, is described in detail with reference to the following figures. The drawings are provided for purposes of illustration only and merely depict examples of the disclosure. These drawings are provided to facilitate the reader's understanding of the disclosure and should not be considered limiting of the breadth, scope, or applicability of the disclosure. It should be noted that for clarity and ease of illustration these drawings are not necessarily made to scale.

FIGS. 3A-3D illustrate the bi-directional/symmetric operation of one embodiment of the present invention's MDTJ, with parallel top and bottom reference layers, wherein spin transfer torque from the thinner tunnel junction determines the direction of the magnetic DW (Domain Wall) motion.

FIGS. 6A-6D illustrate the bi-directional/symmetric operation of one embodiment of the present invention's MDTJ, with anti-parallel top and bottom reference layers, wherein spin transfer torques from both the tunnel barriers act in a synchronous fashion and determine the direction of the magnetic DW motion.

FIGS. 11A-B depict non-limiting examples of the present invention's method for adjusting the conductance associated with the synaptic weight element.

DESCRIPTION OF THE PREFERRED EMBODIMENTS

Figures 1A, 1B:
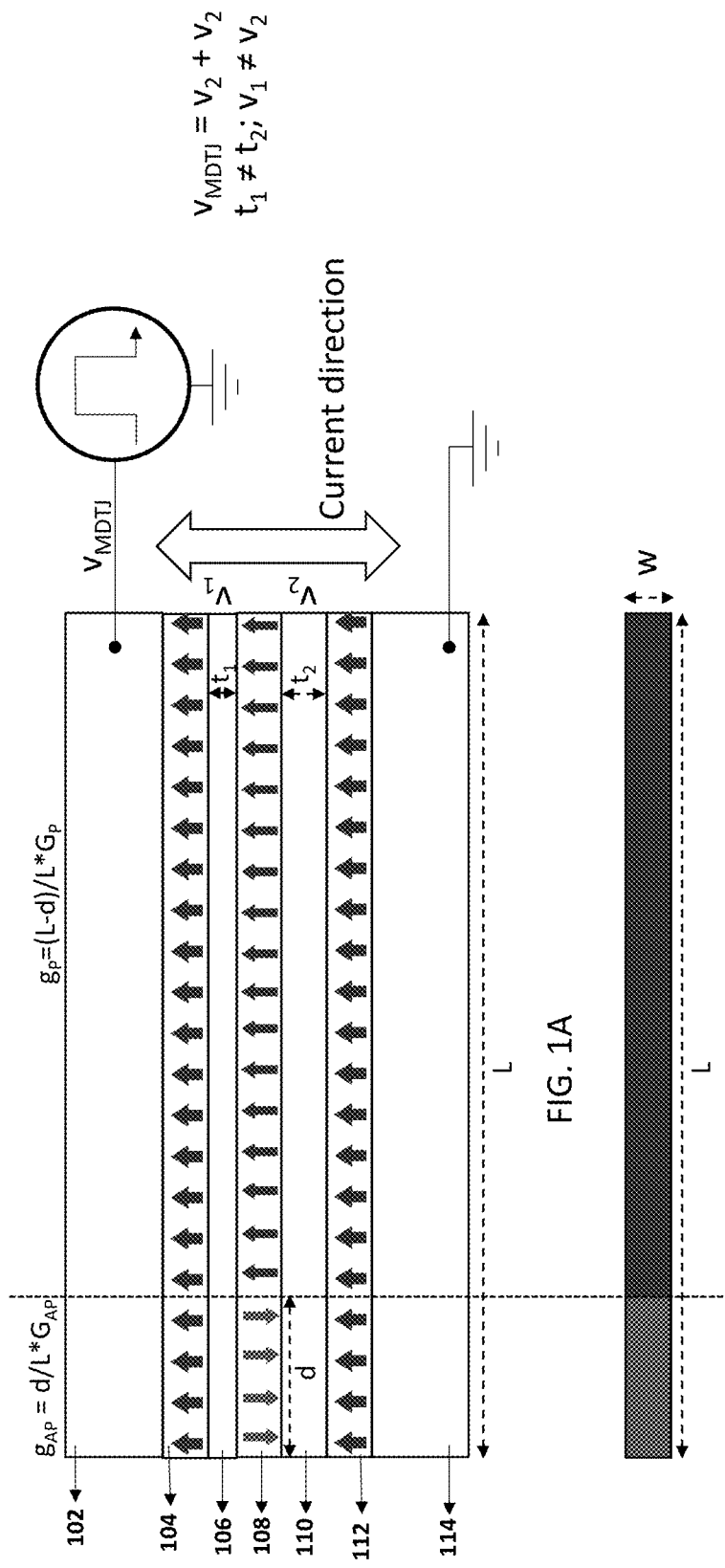
FIGS. 1A-B depict a cross-section schematic and a top view of the magnetic free layer, respectively, of the present invention's MDTJ (Magnetic Double Tunnel Junction).

While this invention is illustrated and described in preferred embodiments and aspects, the invention may be produced in many different configurations. There is depicted in the drawings, and will herein be described in detail, preferred embodiments and aspects of the invention, with the understanding that the present disclosure is to be considered as an exemplification of the principles of the invention and the associated functional specifications for its construction and is not intended to limit the invention. Those skilled in the art will envision many other possible variations within the scope of the present invention.

Note that in this description, references to "one embodiment" or "an embodiment" mean that the feature being referred to is included in at least one embodiment of the invention. Further, separate references to "one embodiment" in this description do not necessarily refer to the same embodiment; however, neither are such embodiments mutually exclusive, unless so stated and except as will be readily apparent to those of ordinary skill in the art. Thus, the present invention can include any variety of combinations and/or integrations of the embodiments described herein.

The present invention provides a magnetic double tunnel junction (MDTJ) (which, in a preferred embodiment, has a large aspect ratio, wherein length L of the MDTJ>>width w of the MDTJ) in order to have magnetic domain wall(s) or DW(s) in the free layer of the MDTJ, wherein controlled creation and/or movement of the DW(s) across the free layer is effected in response to the polarity, magnitude, and duration of a voltage pulse across the MDTJ. The motion and relative position of DW(s) causes the conductance of the MDTJ (that is measured across the MDTJ) to change in a symmetric and linear fashion. By reversing the polarity of the bias voltage, the direction of the DW(s) motion can be reversed, thereby allowing for a bi-directional and symmetric response to the input pulse.

FIGS. 1A-B depict a cross-section schematic and a top view, respectively, of one embodiment's MDTJ. The magnetic free layer of the MDTJ is sandwiched by two magnetic reference layers that have fixed magnetizations. A magnetic DW is shown in the magnetic free layer at a distance d from the left edge. The cross-section of the MDTJ shown in FIG. 1A comprises: (i) an upper electrical contact 102, (ii) a first magnetic reference layer 104 directly underlying the upper electrical contact 102; (iii) a first insulating tunnel barrier 106 directly underlying the first magnetic reference layer 104; (iv) a magnetic free layer 108 directly underlying the first insulating tunnel barrier 106; (v) a second insulating tunnel barrier 110 directly underlying the magnetic free layer 108; (vi) a second magnetic reference layer 112 directly underlying the second insulating tunnel barrier 110, and (vii) a lower electrical contact directly underlying the second magnetic reference layer.

As a non-limiting example, the magnetic reference layers 104 could be formed from synthetic anti-ferromagnetic multi-layers such as (from bottom to the top, where the numbers against the various elements indicate their respective thickness in Angstroms, and numbers preceding 'x' imply repetitions of the corresponding bi-layers that are indicated within { }):

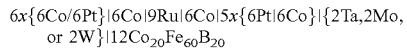

$6x\{6Co/6Pt\}|6Co|9Ru|6Co|5x\{6Pt|6Co\}|\{2Ta,2Mo,$ or $2W\}|12Co_{20}Fe_{60}B_{20}$

Similarly, 112 could be formed from synthetic anti-ferromagnetic multi-layers such as (from bottom to the top, where the numbers against the various elements indicate their respective thickness in Angstroms, and numbers preceding 'x' imply repetitions of the corresponding bi-layers that are indicated within { }):

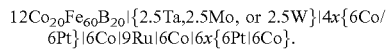

$12Co_{20}Fe_{60}B_{20}|\{2.5Ta,2.5Mo,$ or $2.5W\}|4x\{6Co/6Pt\}|6Co|9Ru|6Co|6x\{6Pt|6Co\}$.

The magnetic free layer 108 could be formed from:

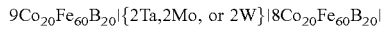

$9Co_{20}Fe_{60}B_{20}|\{2Ta,2Mo,$ or $2W\}|8Co_{20}Fe_{60}B_{20}|$

The thinner and the thicker insulating tunnel barriers 106 and 110 can be formed from 11 Angstroms of MgO and 14 Angstroms of MgO, respectively.

It should be noted that the film stacks mentioned above are illustrative and non-limiting examples. One could also obtain reference layers without any synthetic-antiferromagnetic exchange.

The two tunnel barriers have different thicknesses $t_1$ and $t_2$ as indicated, so that for a current flowing across the MDTJ, the voltages $v_1$ and $v_2$, respectively, across the two tunnel barriers are different. For the configuration (as in FIGS. 1A-B) where the two reference layers are parallel to each other, this ensures that the spin transfer torques across the two tunnel barriers will be of different magnitudes, so that the remnant spin transfer torque causes the magnetic DW or a plurality of DWs to be created and/or to be moved along the magnetic free layer.

For the configuration (FIG. 4A) where the two reference layers are anti-parallel to each other, the choice of two tunnel barriers with different thicknesses $t_1$ and $t_2$ as indicated ensures that the spin transfer torques across the two tunnel barriers act in unison to cause the magnetic DW or a plurality of DWs to be created and/or to be moved along the magnetic free layer.

As noted above, in a preferred embodiment, the present invention's MDTJ device has a large aspect ratio, wherein length L of the MDTJ>>width w of the MDTJ. In one non-limiting example, for illustration purposes only, L may be 100 nm and w may be 10 nm. In another non-limiting example, for illustration purposes only, L may be 66.67 nm and w may be 15 nm. It should be noted that in both illustrative and non-limiting examples, L and w are picked so that the cross-section area in both instances, i.e., L×w, is similar, i.e., $10^3$ $nm^2$.

Figure 2B:
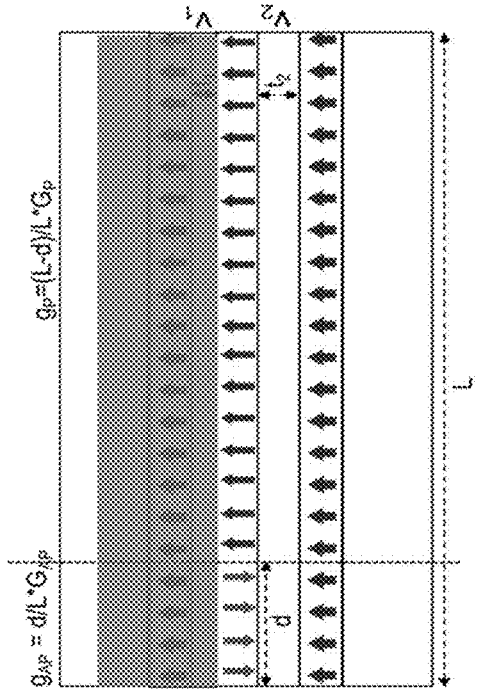
FIGS. 2A-B depict one embodiment of the MDTJ, with parallel top and bottom reference layers, during a write and read operation, respectively.
Figure 2A:
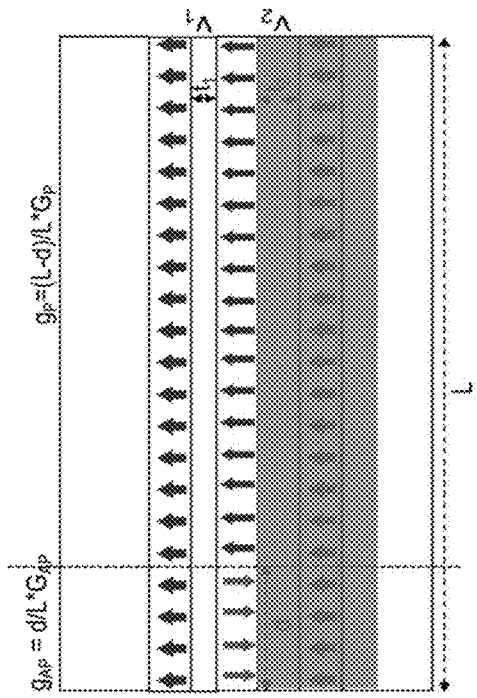

FIGS. 2A-B depict the MDTJ during a write and read operation, respectively. The DW is moved laterally in the magnetic free layer by nanosecond (ns) long voltage pulses, $V_{MDTJ}$, across the MDTJ. During the write operation depicted in FIG. 2A, the spin transfer torque across the thinner tunnel barrier (i.e., $t_1$, in this non-limiting example) will determine the direction of the magnetic DW motion, since the spin transfer torque at a lower voltage $V_1$ will be of larger magnitude and thus more effective than that of the higher voltage $V_2$.

During a write operation, a large $V_{MDTJ}$ (which, in a non-limiting example may be ~0.5V-1V) is applied to the MDTJ. DW motion is guided by the voltage across the thinner tunnel barrier ($t_1$, in this non-limiting example), since spin transfer torque efficiency decreases with increasing voltage across a tunnel barrier.

During the read operation depicted in FIG. 2B, since the resistance of the thicker tunnel barrier ($t_2$, in this non-limiting example) will be higher than that of the thinner tunnel barrier ($t_1$, in this non-limiting example), the resistance contrast, i.e., the tunnel magneto conductance (TMG) [TMG=$(G_P-G_{AP})/G_{AP}$] or tunnel magneto resistance (TMR) [TMR=$(R_{AP}-R_P)/R_P$] will be determined from the thicker tunnel barrier. During the read operation depicted in FIG. 2B, smaller $V_{MDTJ}$ (which, in a non-limiting example may be ~0.1V) is applied across the MDTJ. Accordingly, during read, the voltage drop across both junctions is small and, by extension, a high TMR (or TMG) is observed from both junctions.

The conductance across the tunnel junction is given by the equation, $$G=G_P(1-TMG*d/L)$$

where, $G_P$ ($G_{AP}$) is the parallel (anti-parallel) conductance of the MDTJ, Tunneling Magneto Conductance (TMG)= $(G_P-G_{AP})/G_P$. The above equation implies that the conductance of the DMTJ changes linearly with the magnetic DW position d.

Please note that since during a read, the TMG (1/TMR) from the thicker tunnel barrier ($t_2$, in this non-limiting example) dominates (see FIG. 2B); therefore, in another embodiment, the reference layer in proximity to the thinner tunnel barrier is formed from in-plane magnetic material, either oriented along the length L of the device or perpendicular to the surface defined by L and t. During a write operation, a combination of the torques from the two tunnel barriers will determine the motion of a magnetic domain wall or a plurality of domain walls in the magnetic free layer.

FIGS. 3A-3D illustrate the bi-directional/symmetric operation of the present invention's MDTJ, wherein spin transfer torque from the thinner tunnel junction determines the direction of the magnetic DW motion. When the $V_{MDTJ}$ polarity is such that electron current, $I_{electron}$, flows from the bottom electrode towards the top electrode, the magnetic DW will move towards the right as shown by the movement of the DW between FIG. 3A to FIG. 3B. This causes the conductance to decrease (i.e., resistance to increase) as shown by the portion of the graph that is pointed to by arrow 302 in FIG. 3D, wherein FIG. 3D is a graph of conductance versus pulse. Reversing the voltage polarity moves the magnetic DW in the opposite direction (i.e., to the left). Switching the $V_{MDTJ}$ polarity causes the magnetic DW to move in the opposite direction thereby exhibiting a bi-directional and symmetric response, as shown by the movement of the DW between FIG. 3B to FIG. 3C. This causes the conductance to increase (i.e., resistance to decrease) as shown by the portion of the graph that is pointed to by arrow 304 in FIG. 3D.

TABLE 1 below outlines the relationships between the electron current polarity, the DW motion direction, and the conductivity (i.e., increase or decrease in conductivity) for the example shown in FIGS. 3A-D. In the present invention, a magnetic domain wall in the magnetic free layer (FIG. 1A) can have two polarities: up-down (↑↓) or down-up (↓↑). Specifically, the magnetic free layer as shown in FIG. 1A contains a down-up (↓↑) domain wall. It should be noted that for a given current polarity, the domain wall with opposite polarity will move in the opposite direction resulting in the same change in conductivity, i.e., the change in conductance gets determined by the polarity of the current regardless of which polarity of domain wall gets created and/or moved.

TABLE 1

| Electron Current Polarity | DW Motion | Conductivity (G) |
|---|---|---|
| Bottom to Top | Right | Decrease |
| Top to Bottom | Left | Increase |

Figures 4A, 4B:
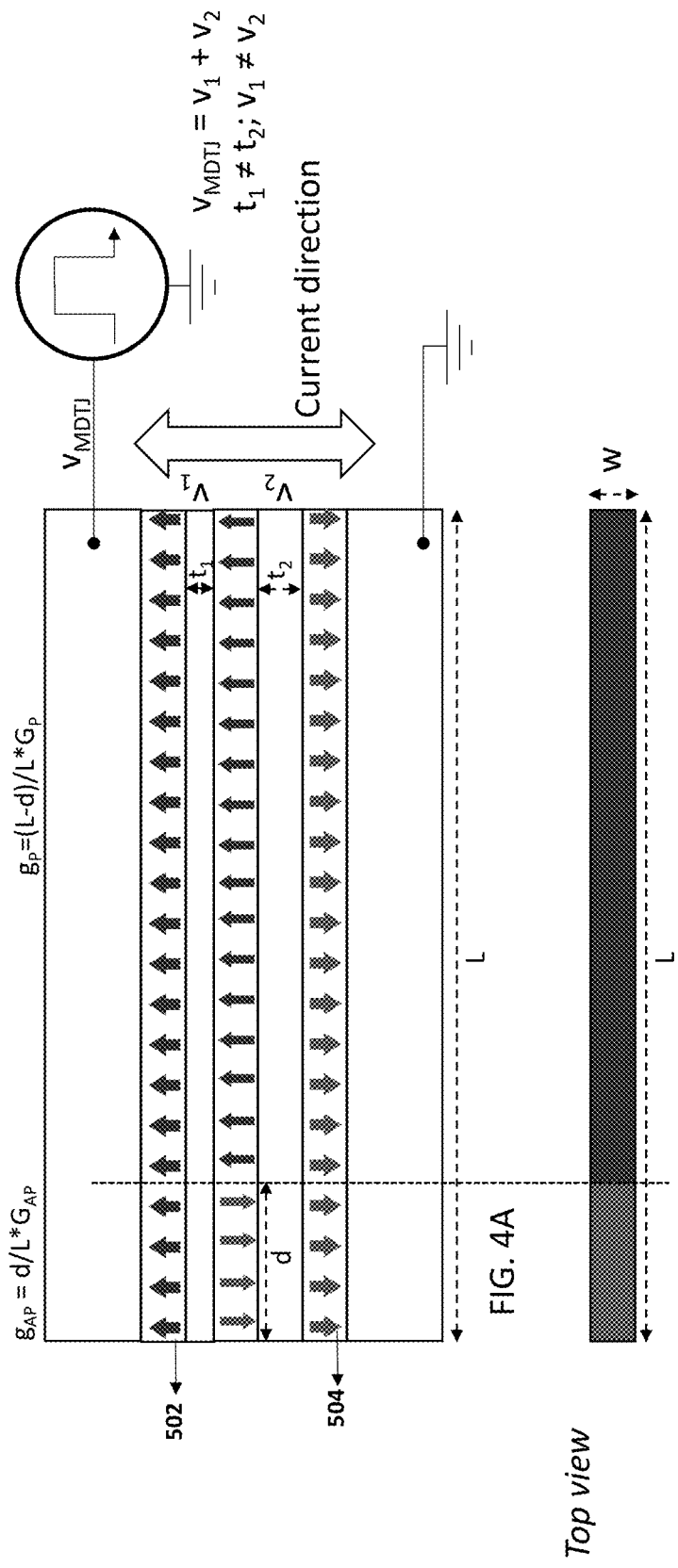
FIGS. 4A-B depict a cross-section schematic and a top view of the magnetic free layer, respectively, of the present invention's MDTJ.
Figure 5B:
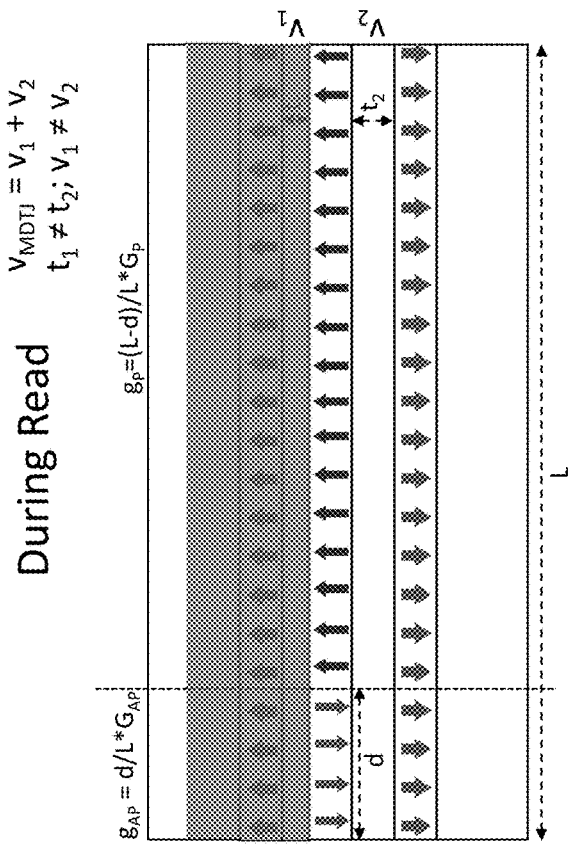
FIGS. 5A-B depict one embodiment of the MDTJ, with anti-parallel top and bottom reference layers, during a write and read operation, respectively.
Figure 5A:
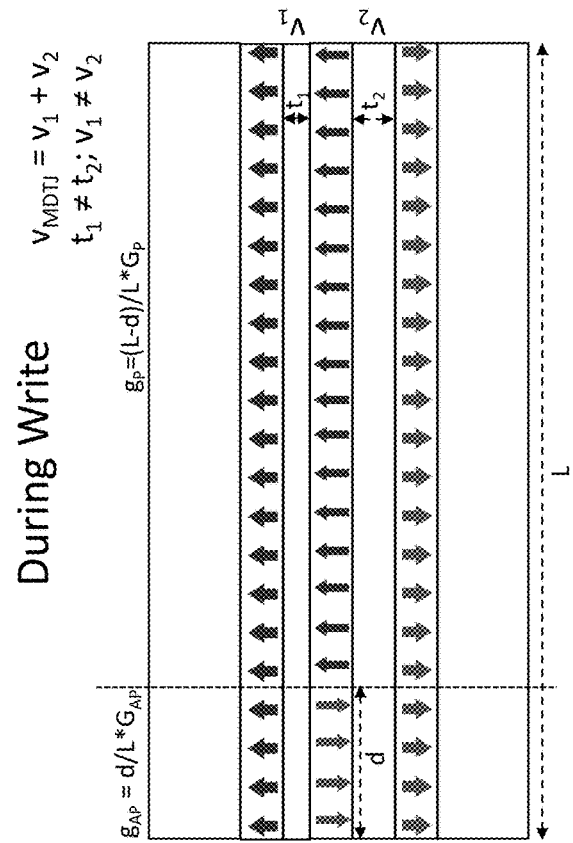

While FIG. 1A depicts magnetic reference layers 104 and 112 that are parallel to each other, other embodiments are also envisioned. For example, FIGS. 4A and 5A-B depict another embodiment, where the magnetic reference layers 502 and 504 have been engineered to be anti-parallel to each other. In this embodiment, a magnetic domain wall or a plurality of domain walls in the magnetic free layer are created and/or moved by the two torques from both the tunnel barriers acting in unison. During read operation, the TMG (or TMR) is still dominated by the thicker tunnel barrier.

FIGS. 5A-B depict the MDTJ during a write and read operation, respectively, where the magnetic reference layers are anti-parallel to each other. A DW or a plurality of DWs are created and/or moved laterally in the free layer by nanosecond long voltage pulses ($V_{MDTJ}$) across the MDTJ. During write (FIG. 5A), large $V_{MDTJ}$ (~0.5-1V) is applied and DW motion is guided by the spin-transfer torque (STT) from both tunnel barriers. During read (FIG. 5B), smaller $V_{MDTJ}$ (~0.1V) is applied and TMG (or TMR) is dominated by the thicker tunnel barrier.

FIGS. 6A-D illustrate the bi-directional/symmetric operation of the present invention's MDTJ, wherein spin transfer torques from both tunnel barriers act in a synchronous fashion to determine the direction of the magnetic DW motion. TABLE 2, below, outlines the relationships between the electron current polarity, the DW motion direction, and the conductivity (i.e., increase or decrease in conductivity) for the example shown in FIGS. 6A-D. In the present invention, a magnetic domain wall in the magnetic free layer (FIG. 4A) can have two polarities: up-down (↑↓) or down-up (↓↑). Specifically, the magnetic free layer as shown in FIG. 4A contains a down-up (↓↑) domain wall. It should be noted that for a given current polarity, the domain wall with opposite polarity will move in the opposite direction resulting in the same change in conductivity, i.e., the change in conductance gets determined by the polarity of the current regardless which polarity of domain wall gets created and/or moved.

When the $V_{MDTJ}$ polarity is such that electron current flows from the top electrode towards the bottom electrode, the magnetic DW will move towards the left as shown by the movement of the DW between FIG. 6A to FIG. 6B. This causes the conductance to decrease (resistance to increase) as shown by the portion of the graph that is pointed to by arrow 602 in FIG. 6D, wherein FIG. 6D is a graph of conductance versus pulse. Reversing the voltage polarity moves the magnetic DW in the opposite direction (i.e., right). Switching the $V_{MDTJ}$ polarity causes the magnetic DW to move in the opposite direction, thereby exhibiting a bi-directional and symmetric response, as shown by the movement of the DW between FIG. 6B to FIG. 6C. This causes the conductance to increase (resistance to decrease) as shown by the portion of the graph that is pointed to by arrow 604 in FIG. 6D.

TABLE 2

| Electron Current Polarity | DW Motion | Conductivity (G) |
|---|---|---|
| Bottom to Top | Right | Decrease |
| Top to Bottom | Left | Increase |

Figure 11A:
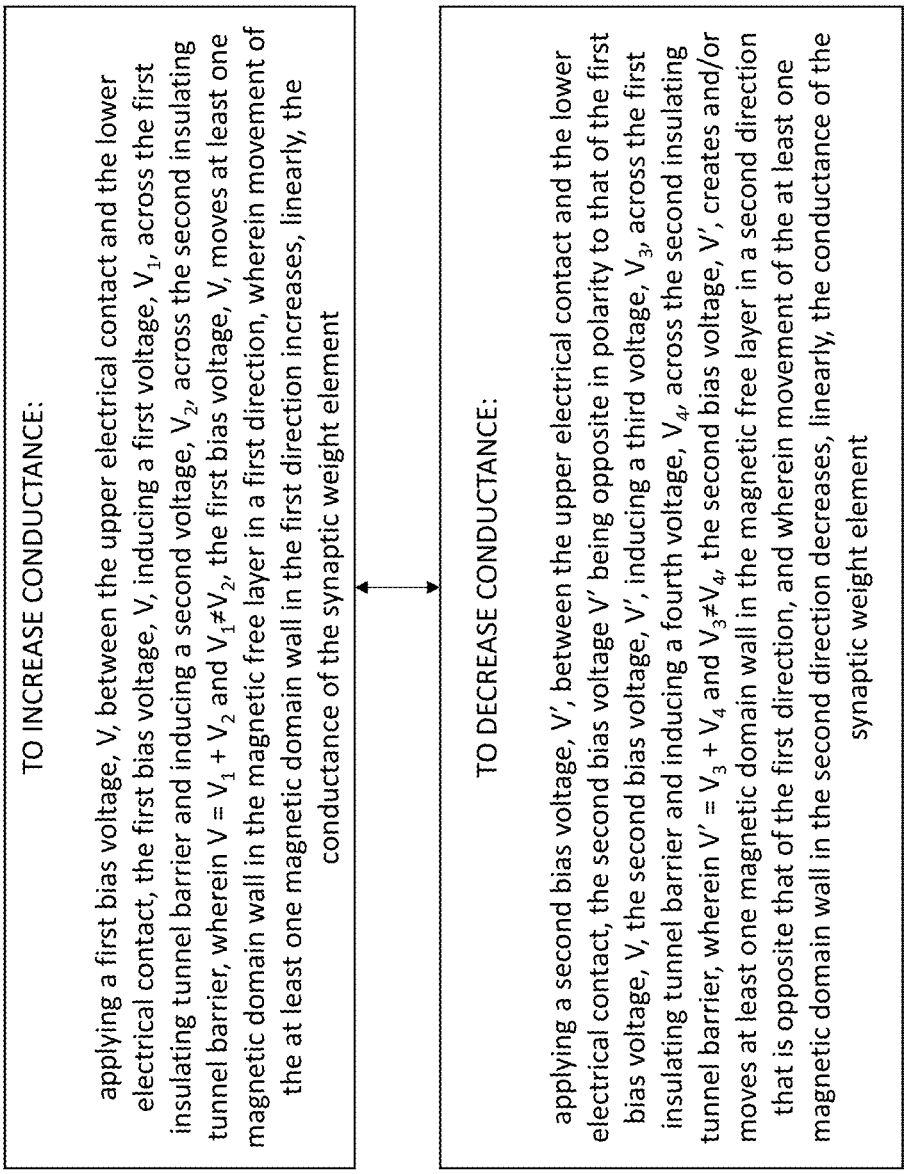

FIG. 11A depicts one non-limiting example of the present invention's method for adjusting the conductance associated with the synaptic weight element. When the conductance of the synaptic weight element is to be increased, a first bias voltage V is applied between the upper electrical contact (layer 102 in FIG. 1A) and the lower electrical contact (layer 114 in FIG. 1A), wherein the first bias voltage V induces a first voltage $V_1$ across the first insulating tunnel barrier (layer 106 in FIG. 1A) and induces a second voltage $V_2$ across the second insulating tunnel barrier (layer 110 in FIG. 1A). It is noted that $V=V_1+V_2$ and $V_1 \neq V_2$. The first bias voltage V creates and/or moves at least one magnetic domain wall in the magnetic free layer (layer 108 in FIG. 1A) in a first direction, wherein creation and/or movement of the at least one magnetic domain wall in the first direction increases, linearly, the conductance of the synaptic weight element.

In FIG. 11A, when the conductance of the synaptic weight element is to be decreased, a second bias voltage V' is applied between the upper electrical contact (layer 102 in FIG. 1A) and the lower electrical contact (layer 114 in FIG. 1A), wherein the second bias voltage V' is opposite in polarity to that of the first bias voltage V and the second bias voltage V' induces a third voltage $V_3$ across the first insulating tunnel barrier (layer 106 in FIG. 1A) and inducing a fourth voltage $V_4$ across the second insulating tunnel barrier (layer 110 in FIG. 1A). It is noted, as above, $V'=V_3+V_4$ and $V_3 \neq V_4$. The second bias voltage V' creates and/or moves at least one magnetic domain wall in the magnetic free layer (layer 108 in FIG. 1A) in a second direction that is opposite that of the first direction, wherein creation and/or movement of the at least one magnetic domain wall in the second direction decreases, linearly, the conductance of the synaptic weight element.

FIG. 11B depicts one non-limiting example of the present invention's method for adjusting the conductance associated with the synaptic weight element. When the conductance of the synaptic weight element is to be increased, a first bias voltage V is applied between the upper electrical contact (layer 102 in FIG. 1A) and the lower electrical contact (layer 114 in FIG. 1A), wherein the first bias voltage V induces a first current $I_1$ travelling from the upper electrical contact (layer 102 in FIG. 1A) to the lower electrical contact (layer 114 in FIG. 1A). The first bias voltage V creates and/or moves at least one magnetic domain wall in the magnetic free layer (layer 108 in FIG. 1A) in a first direction, wherein creation and/or movement of the at least one magnetic domain wall in the first direction increases, linearly, the conductance of the synaptic weight element.

In FIG. 11B, when the conductance of the synaptic weight element is to be decreased, a second bias voltage V' is applied between the upper electrical contact (layer 102 in FIG. 1A) and the lower electrical contact (layer 114 in FIG. 1A), wherein the second bias voltage V' is opposite in polarity to that of the first bias voltage V, and the second bias voltage V', induces a second current $I_2$, travelling from the lower electrical contact (layer 114 in FIG. 1A) to the upper electrical contact (layer 102 in FIG. 1A). The second bias voltage V' creates and/or moves at least one magnetic domain wall in the magnetic free layer (layer 108 in FIG. 1A) in a second direction that is opposite that of the first direction, wherein creation and/or movement of the at least one magnetic domain wall in the second direction decreases, linearly, the conductance of the synaptic weight element.

It should be noted in both FIGS. 11A and 11B there are double arrows linking the boxes for increasing and decreasing conductance, because the value of the conductance may have to be decreased (from a higher value to a lower value) or increased (from a lower value to a higher value) depending on the desired synaptic weight.

Example Device Metrics: Provided below is a non-limiting example of a device manufactured as per the teachings of the present invention. Specific numbers provided are provided as example only.

Example Requirements (Per Device):
Technology Constraints:
1. $V_{write}\sim1.0V$ ($v_1=0.1V$, $v_2=0.9V$), and Max($I_{write}$)~10 uA→$R_P$~100 kΩ or $G_P$~10 uS
2. $V_{read}\sim0.1V$ ($v_1=0.01V$, $v_2=0.09V$), and Max($I_{read}$)~0.2 uA→$R_P$ 500 kΩ or $G_P$~2 uS Physics Constraints (During Write Operation):
1. Minimum current density for DW motion, $j_{min}\sim10^6$ A/cm$^2$
2. $\{v_1/t_1, v_2/t_2\}<1V/nm$
→Cross-sectional Area (MTJ): $A_{device}$ (w×L)=$10^3$ nm$^2$ (For example, w=10 nm & L=100 nm)
→RA (MTJ)~300 Ω-um$^2$; (tunnel barriers $t_1$~1.1 nm and $t_2$~1.5 nm thick)
→TMR~200%, →$G_P/G_{AP}$~3

Figure 7:
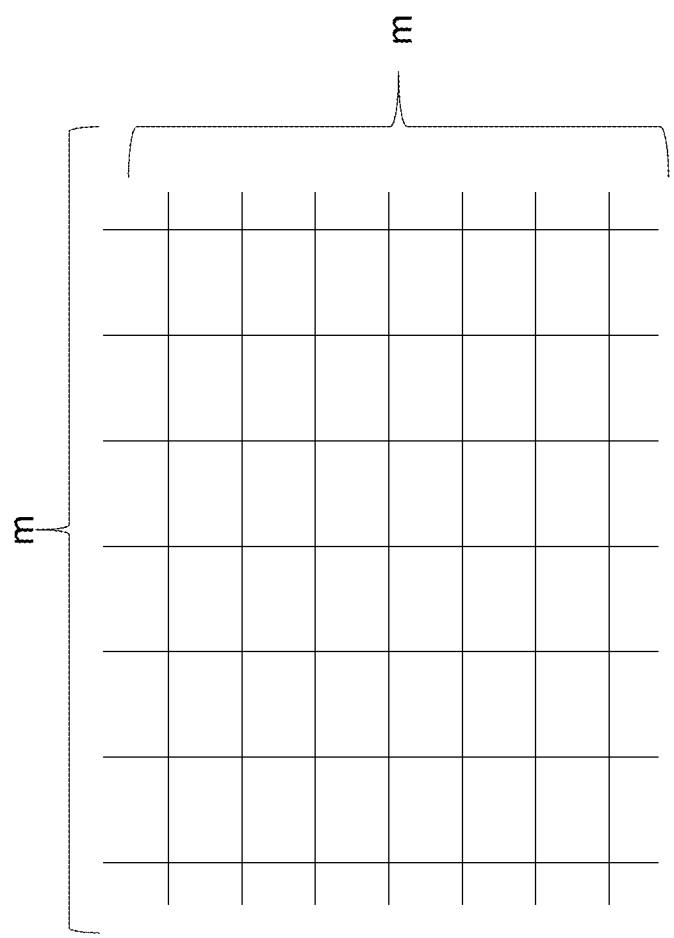
FIG. 7 depicts a generic example of cross-bar array that may be used, for example, in neuromorphic computing.

Listed here a few possibilities of resistance range of the synaptic devices depending upon the chosen RA of the device.
100 resistance states: 300 kΩ to 900 kΩ in steps of 6 kΩ, or
100 resistance states: 200 kΩ to 600 kΩ in steps of 4 kΩ, or
100 resistance states: 100 kΩ to 300 kΩ in steps of 2 kΩ
For w=10 nm, L=100 nm
Controlled DW motion with 1-2 nm resolution→100-50 discrete linear & bi-directional steps
DW velocity at near threshold current~10 nm/ns→pulse length~0.1-0.5 ns=2-10 GHz
Energy per write (@1 GHz): 10 fJ; Power per device: 10 uW In one embodiment, the MDTJ device is part of a 2D cross-bar array, where the present invention's MDTJ devices may be of a variety of shapes. FIG. 7 depicts a generic example of a cross-bar array that may be used, for example, in neuromorphic computing.

Figure 8B:
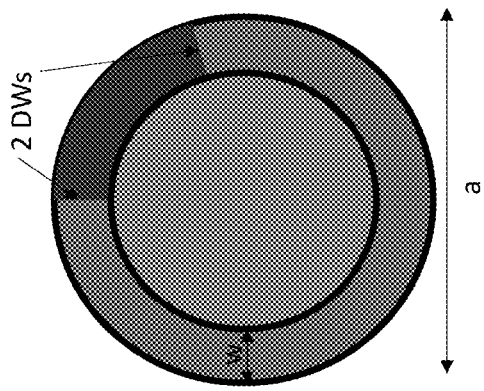
FIGS. 8A-C depict a non-limiting example of a crossbar array having an array of ring-shaped synaptic MDTJ devices as per the teachings of the present invention, where the devices may be closed ring-shaped structures (as shown in FIG. 5B) or open ring-shaped structures (as shown in FIG. 8C).
Figure 8C:
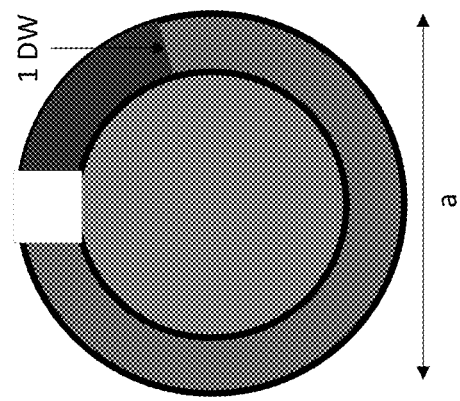
Figure 8A:
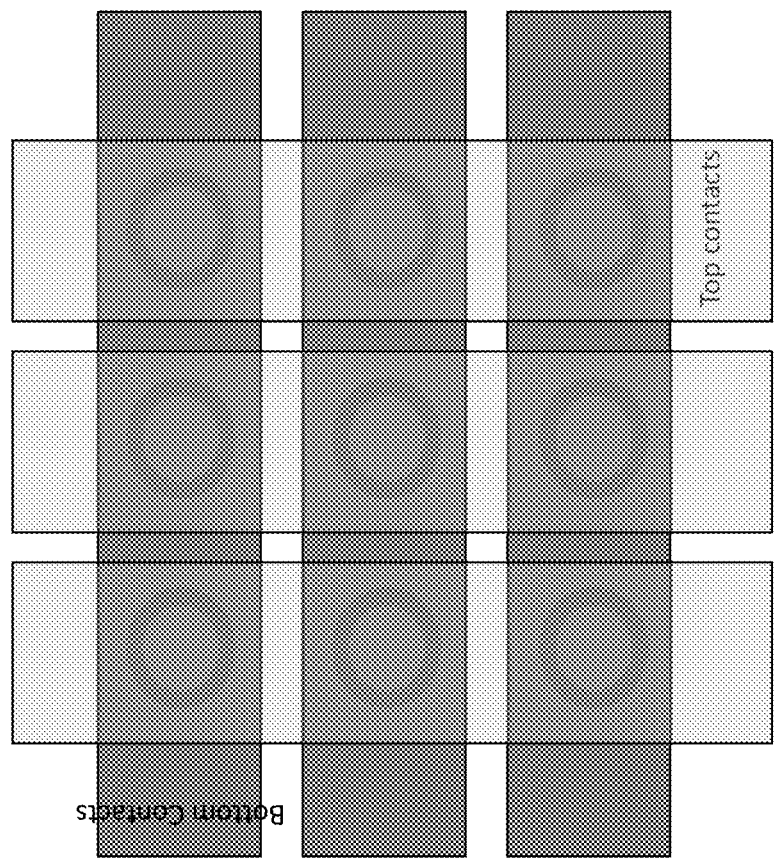

FIGS. 8A-C depict a non-limiting example of a crossbar array having an array of ring-shaped synaptic MDTJ devices as per the teachings of the present invention, where the devices may be closed ring-shaped structures (as shown in FIG. 8B) or open ring-shaped structures (as shown in FIG. 8C). Open devices (see FIG. 8C) may have any number (i.e., odd or even number of magnetic DWs) of magnetic DWs, whereas closed devices (see FIG. 8B), for example, ring-shaped devices will have an even number of magnetic DWs.

It should be noted that while only two variations (closed and open ring-shaped devices) are shown in FIGS. 8A-C, other shapes of the present invention MDTJ device are within the scope of the present invention.

Figure 9B:
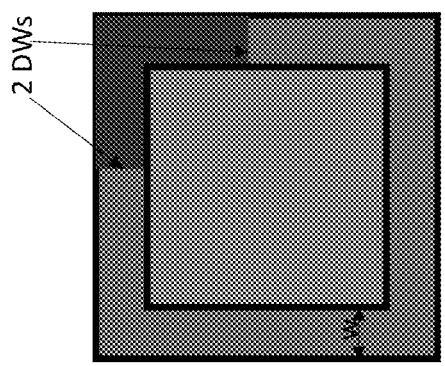
FIGS. 9A-C depict another non-limiting example of a crossbar array having an array of square-shaped synaptic MDTJ devices as per the teachings of the present invention, where the square-shaped devices may be closed square-shaped structures (as shown in FIG. 9B) or open square-shaped structures (as shown in FIG. 8C).
Figure 9C:
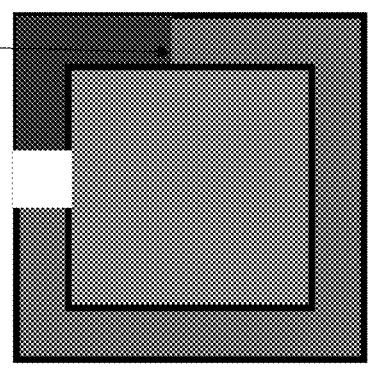
Figure 9A:
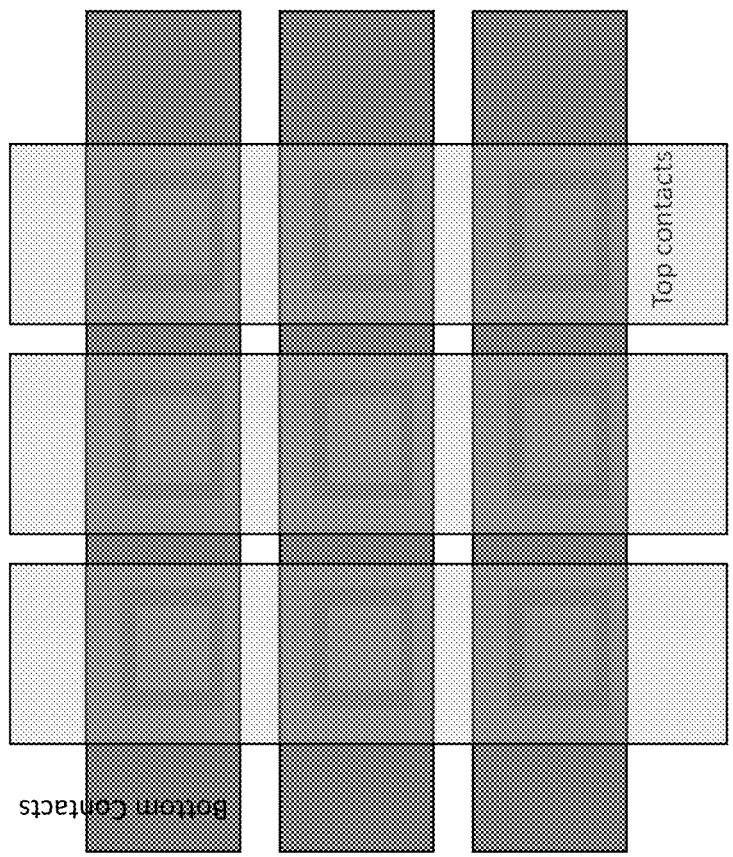
Figure 10A:
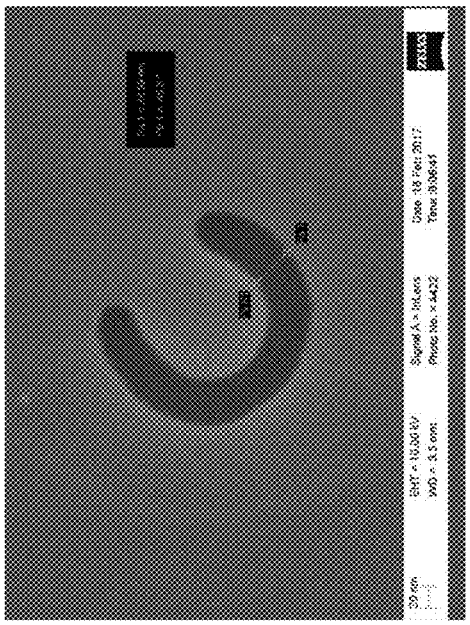
FIGS. 10A-D depict top views of a closed ring-shaped MDTJ device, an open ring-shaped MDTJ device, a closed square-shaped MDTJ device, an open square-shaped MDTJ device, respectively.
Figure 10B:
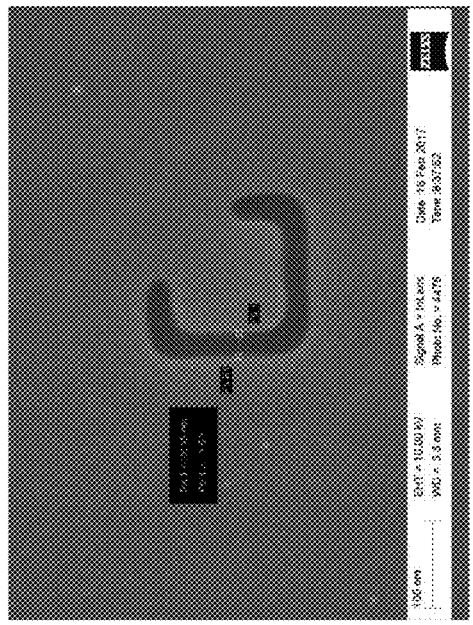
Figure 10C:
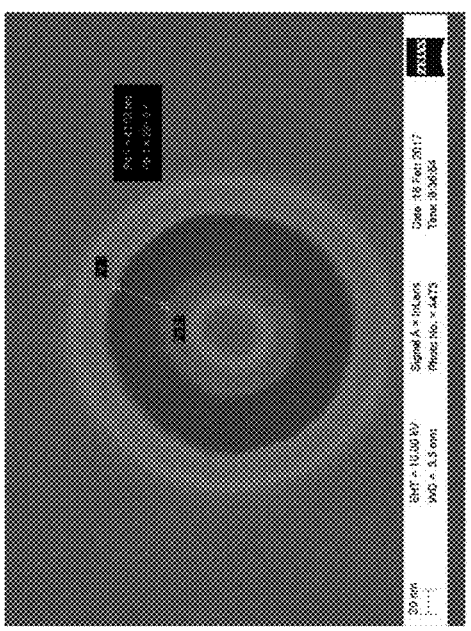
Figure 10D:
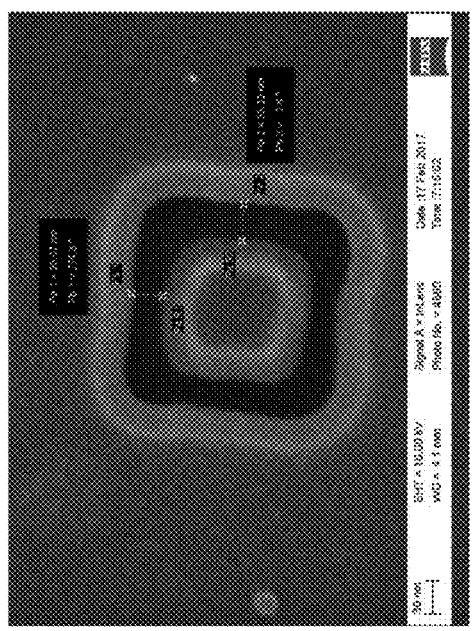

For example, FIGS. 9A-C depict another non-limiting example of a crossbar array having an array of square-shaped synaptic MDTJ devices as per the teachings of the present invention, where the square-shaped devices may be closed square-shaped structures (as shown in FIG. 9B) or open square-shaped structures (as shown in FIG. 9C).

FIGS. 10A-D depict top views of a closed ring-shaped MDTJ device, an open ring-shaped MDTJ device, a closed square-shaped MDTJ device, and an open square-shaped MDTJ device, respectively.

The present invention's MDTJ device approach meets all the key attributes of a 2-terminal synaptic device essential for next generation neuromorphic devices, and offers symmetric, continuous and linear weight update, with ultrafast GHz operation and 10 fJ energy per partial write per device, 0.1 fJ per read per device operation.

CONCLUSION

A system and method have been shown in the above aspects and embodiments for the effective implementation of a magnetic domain wall-based non-volatile, linear, symmetric and bi-directional synaptic weight element. While various preferred embodiments have been shown and described, it will be understood that there is no intent to limit the invention by such disclosure, but rather, it is intended to cover all modifications falling within the spirit and scope of the invention, as defined in the appended claims.

What is claimed is:

1. A method of adjusting conductance of a synaptic weight element,
the synaptic weight element comprising: an upper electrical contact; a first magnetic reference layer directly underlying the upper electrical contact; a first insulating tunnel barrier directly underlying the first magnetic reference layer; a magnetic free layer directly underlying the first insulating tunnel barrier; a second insulating tunnel barrier directly underlying the magnetic free layer; a second magnetic reference layer directly underlying the second insulating tunnel barrier, and a lower electrical contact directly underlying the second magnetic reference layer, the first and second insulating tunnel barriers having different electrical resistance;
the method comprising:
when the conductance of the synaptic weight element is to be increased, applying a first bias voltage V between the upper electrical contact and the lower electrical contact, so that the first bias voltage V induces a first voltage $V_1$ across the first insulating tunnel barrier and induces a second voltage $V_2$ across the second insulating tunnel barrier, wherein $V=V_1+V_2$ and $V_1 \neq V_2$, wherein the first bias voltage V creates and/or moves at least one magnetic domain wall in the magnetic free layer in a first direction, wherein creation and/or movement of the at least one magnetic domain wall in the first direction increases the conductance of the synaptic weight element; and
when the conductance of the synaptic weight element is to be decreased, applying a second bias voltage V' between the upper electrical contact and the lower electrical contact, the second bias voltage V' being opposite in polarity to that of the first bias voltage V, the second bias voltage V' inducing a third voltage $V_3$ across the first insulating tunnel barrier and inducing a fourth voltage $V_4$ across the second insulating tunnel barrier, wherein $V'=V_3+V_4$ and $V_3 \neq V_4$, and the second bias voltage V' creates and/or moves at least one magnetic domain wall in the magnetic free layer in a second direction that is opposite that of the first direction, and wherein creation and/or movement of the at least one magnetic domain wall in the second direction decreases the conductance of the synaptic weight element.

2. The method as per claim 1, wherein the synaptic weight element is used in an artificial neural network (ANN).

3. The method as per claim 1, wherein the synaptic weight element is used for data storage.

4. The method as per claim 1, wherein the synaptic weight element is used for neuromorphic computing.

5. The method as per claim 1, wherein the synaptic weight element is substantially cylindrical.

6. The method as per claim 1, wherein the conductance, G, is given by $G=G_p(1-TMG*d/L)$, wherein $G_P$ is the parallel conductance of the device, TMG is the tunnel magneto conductance given by $(G_P-G_{AP})/G_P$ where $G_P$ is the parallel conductance, $G_{AP}$ is the anti-parallel conductance of the device, L is the length of the device, and d is the location of the at least one magnetic domain.

7. The method as per claim 1, wherein the synaptic weight element is part of a crossbar array.

8. The method as per claim 1, wherein the synaptic weight element is made in one of the following shapes: ring, split-ring, square, split-square, or a two-dimensional shape.

9. The method of claim 1, wherein the magnetic reference layer in vicinity of the lower resistance insulating tunnel barrier is formed from in-plane magnetic material.

10. The method of claim 1, wherein magnetization states of the first and second magnetic reference layers are anti-parallel to each other.

11. The method of claim 1, wherein magnetization states of the first and second magnetic reference layers are parallel to each other.

12. A method of adjusting conductance of a synaptic weight element,
the synaptic weight element comprising: an upper electrical contact; a first magnetic reference layer directly underlying the upper electrical contact; a first insulating tunnel barrier directly underlying the first magnetic reference layer; a magnetic free layer directly underlying the first insulating tunnel barrier; a second insulating tunnel barrier directly underlying the magnetic free layer; a second magnetic reference layer directly underlying the second insulating tunnel barrier, and a lower electrical contact directly underlying the second magnetic reference layer, the first and second insulating tunnel barriers of different electrical resistance;
the method comprising:
when the conductance of the synaptic weight element is to be decreased, applying a first bias voltage V between the upper electrical contact and the lower electrical contact, so that the voltage V induces a first current $I_1$ travelling from the upper electrical contact to the lower electrical contact, the first bias voltage V creating and/or moving at least one magnetic domain wall in the magnetic free layer in a first direction, wherein creation and/or movement of the at least one magnetic domain wall in the first direction decreases the conductance of the synaptic weight element; and
when the conductance of the synaptic weight element is to be increased, applying a second bias voltage V' between the upper electrical contact and the lower electrical contact, the second bias voltage V' being opposite in polarity to that of the first bias voltage V, the second bias voltage V' inducing a second current $I_2$ travelling from the lower electrical contact to the upper electrical contact, wherein the second bias voltage V' creates and/or moves at least one magnetic domain wall in the magnetic free layer in a second direction that is opposite that of the first direction, and wherein creation and/or movement of the at least one magnetic domain wall in the second direction increases the conductance of the synaptic weight element.

13. The method as per claim 12, wherein the synaptic weight element is used in an artificial neural network (ANN).

14. The method as per claim 12, wherein the synaptic weight element is used for data storage.

15. The method as per claim 12, wherein the synaptic weight element is used for neuromorphic computing.

16. The method as per claim 12, wherein the synaptic weight element is substantially cylindrical.

17. The method as per claim 12, wherein the conductance, G, is given by $G=G_p(1-TMG*d/L)$, wherein $G_P$ is the parallel conductance of the device, TMG is the tunnel magneto conductance given by $(G_P-G_{AP})/G_P$ where $G_P$ is the parallel conductance, $G_{AP}$ is the anti-parallel conductance of the device, L is the length of the device, and d is the location of the at least one magnetic domain.

18. The method as per claim 12, wherein the synaptic weight element is part of a crossbar array.

19. The method as per claim 12, wherein the synaptic weight element is made in one of the following shapes: ring, split-ring, square, split-square, and a 2-dimensional shape.

20. The method of claim 12, wherein the magnetic reference layer in vicinity of the lower resistance insulating tunnel barrier is formed from in-plane magnetic material.

21. The method of claim 12, wherein magnetization states of the first and second magnetic reference layers are anti-parallel to each other.

22. The method of claim 12, wherein magnetization states of the first and second magnetic reference layers are parallel to each other.

23. A device, comprising: a synaptic weight element, said a synaptic weight element comprising:
an upper electrical contact;
a first magnetic layer directly underlying the upper electrical contact;
a first tunnel barrier underlying the first magnetic layer;
a second magnetic layer underlying the tunnel barrier;
a second tunnel barrier underlying the second magnetic free layer, the first and second tunnel barriers being of different electrical resistance;
a third magnetic layer underlying the second tunnel barrier;
a lower electrical contact directly underlying the third magnetic layer, wherein the upper electrical contact, the first magnetic layer, the first tunnel barrier, the second magnetic layer, the second tunnel barrier, the third magnetic layer, and the lower electrical contact are in proximity with each other, thereby forming a stack of layers;
means for inducing a first voltage across the first tunnel barrier and inducing a second voltage across the second tunnel barrier, to increase the conductance of the synaptic weight element;
means for inducing a third voltage across the fourth tunnel barrier and inducing a fourth voltage across the second tunnel barrier, to decrease the conductance of the synaptic weight element.

24. The device of claim 23, wherein the device is a linear, bi-directional, symmetric synaptic weight element in an artificial neural network (ANN).

25. The device of claim 23, wherein the device stores data.

26. The device of claim 23, wherein the stack of layers is substantially cylindrical.

27. The device of claim 23, wherein either the first tunnel barrier is thinner than the second tunnel barrier and the second magnetic layer is formed from an in-plane magnetic material or the second tunnel barrier is thinner than the first tunnel barrier and the third magnetic layer is formed from the in-plane magnetic material.

28. The method of claim 23, wherein magnetization states of the first and third magnetic layers are antiparallel to each other.

29. The method of claim 23, wherein magnetization states of the first and third magnetic layers are parallel to each other.

30. A device, comprising: a synaptic weight element, said a synaptic weight element comprising:
   an upper electrical contact;
   a first magnetic layer directly underlying the upper electrical contact;
   a first tunnel barrier underlying the first magnetic layer;
   a second magnetic layer underlying the tunnel barrier;
   a second tunnel barrier underlying the second magnetic free layer, the first and second tunnel barriers being of different electrical resistance; and
   a third magnetic layer underlying the second tunnel barrier;
   a lower electrical contact directly underlying the third magnetic layer, wherein the upper electrical contact, the first magnetic layer, the first tunnel barrier, the second magnetic layer, the second tunnel barrier, the third magnetic layer, and the lower electrical contact are in proximity with each other, thereby forming a stack of layers;
   means for inducing a first current travelling from the upper electrical contact to the lower electrical contact, to decrease the conductance of the synaptic weight element;
   means for inducing a second current travelling from the lower electrical contact to the upper electrical contact, to increase the conductance of the synaptic weight element.

31. The device claim 30, wherein the device is a linear, bi-directional, symmetric synaptic weight element in an artificial neural network (ANN).

32. The device of claim 30, wherein the device stores data.

33. The device of claim 30, wherein the stack of layers is substantially cylindrical.

34. The device of claim 30, wherein either the second magnetic layer is thinner than the third magnetic material and is formed from an in-plane magnetic material or the third magnetic layer is thinner than the second magnetic layer, and is formed from the in-plane magnetic material.

35. The method of claim 30, wherein magnetization states of the first and third magnetic layers are antiparallel to each other.

36. The method of claim 30 wherein magnetization states of the first and third magnetic layers are parallel to each other.

* * * * *